United States Patent [19]
Bate
[11] 3,714,523
[45] Jan. 30, 1973

[54] MAGNETIC FIELD SENSOR

[75] Inventor: Robert Thomas Bate, Richardson, Tex.
[73] Assignee: Texas Instruments Incorporated, Dallas, Tex.

[22] Filed: March 30, 1971
[21] Appl. No.: 129,422

[52] U.S. Cl. ...........317/235 R, 307/304, 317/235 B, 317/235 G, 317/235 H, 324/45
[51] Int. Cl. ..........................H01l 11/14, H01l 15/00
[58] Field of Search...........317/235 B, 235 G, 235 H; 307/309; 330/6, 30 D, 35; 324/45; 329/200

[56] References Cited

FOREIGN PATENTS OR APPLICATIONS 1,145,092 3/1969 Great Britain.......................317/235

OTHER PUBLICATIONS

IBM Tech. Discl. Bul., "Hall Effect Device Feedback Circuit" by Collins, Vol. 13, No. 8, Jan. 1971 page 2448
IBM Tech. Discl. Bul., "Magnetic Switch or Magnetometer" by Fang et al., Vol. 11, No. 6, Nov. 1968 page 637–638
IEEE Trans. on Electron Devices, " A Silicon MOS Magnetic Field Transducer of High Sensitivity by Fry et al., Vol. 16, Jan. 1969 pages 35–39

*Primary Examiner*—Jerry D. Craig
*Attorney*—Andrew M. Hassell, Harold Levine, Melvin Sharp, Michael A. Sileo, Jr., Stephens S. Sadacca, Gary C. Honeycutt, Richard L. Donaldson, John E. Vandigriff and James B. Hinson

[57] ABSTRACT

Disclosed is an insulated gate field effect transistor (IGFET) structure, the electrical state of which is strongly sensitive to the presence of a magnetic field. The structure is defined by a semiconductor substrate having a source diffusion region and two drain diffusion regions spaced therefrom. Two adjacent gate electrodes are formed intermediate the source and drain regions. The two gates are biased to form two inversion layers in the semiconductor material thereunder. Magnetically induced charge coupling between the two inversion layers provides positive feedback during operation and thus effects an extremely sensitive magnetic field detector.

8 Claims, 2 Drawing Figures

INVENTOR
Robert Thomas Bate

Richard L Donaldson

ATTORNEY

MAGNETIC FIELD SENSOR

The present invention relates to magnetic field sensors in general and more particularly to an insulated gate field effect transistor (IGFET) magnetic field detector that utilizes charge coupling between adjacent inversion layers to provide positive feedback.

In many applications requiring contactless switching it is desirable to have an IGFET sensing structure that is responsive to the presence of a magnetic field. Such detectors could be utilized, for example, in ground fault interrupters, magnetic tape pick-ups, keyboards, etc.. Experimental structures of this type are described in Fry et al., IEEE transactions on Electron Devices, Vol. ED–16, page 35, 1969, and Carr et al., 1970 SWIEEECO record of Technical Papers, April 21–24, 1970, Dallas, Texas. A major problem associated with IGFET magnetic field sensors relates to the difficulty of obtaining sufficiently large output signals.

Accordingly, an object of the present invention is to provide an IGFET magnetic field detector structure having two gate electrodes disposed to enhance magnetically induced charge coupling therebetween to provide positive feedback to the structure.

Briefly and in accordance with the present invention, there is provided an IGFET magnetic field detector having enhanced output signals. In one aspect of the invention, a source region is formed on a silicon substrate by diffusion techniques. Two drain regions are also formed on the substrate surface. Two gate electrodes are then formed intermediate the source and drain regions and are biased to produce respective inversion layers in the semiconductor material thereunder so that the longitudinal electric field between the source and drain regions lowers the potential barrier to holes therebetween. Charge coupling between the inversion layers induced by an applied magnetic field produces a differential current which, by virtue of the interconnection of the devices, effects positive feedback and amplification.

Figure 1:
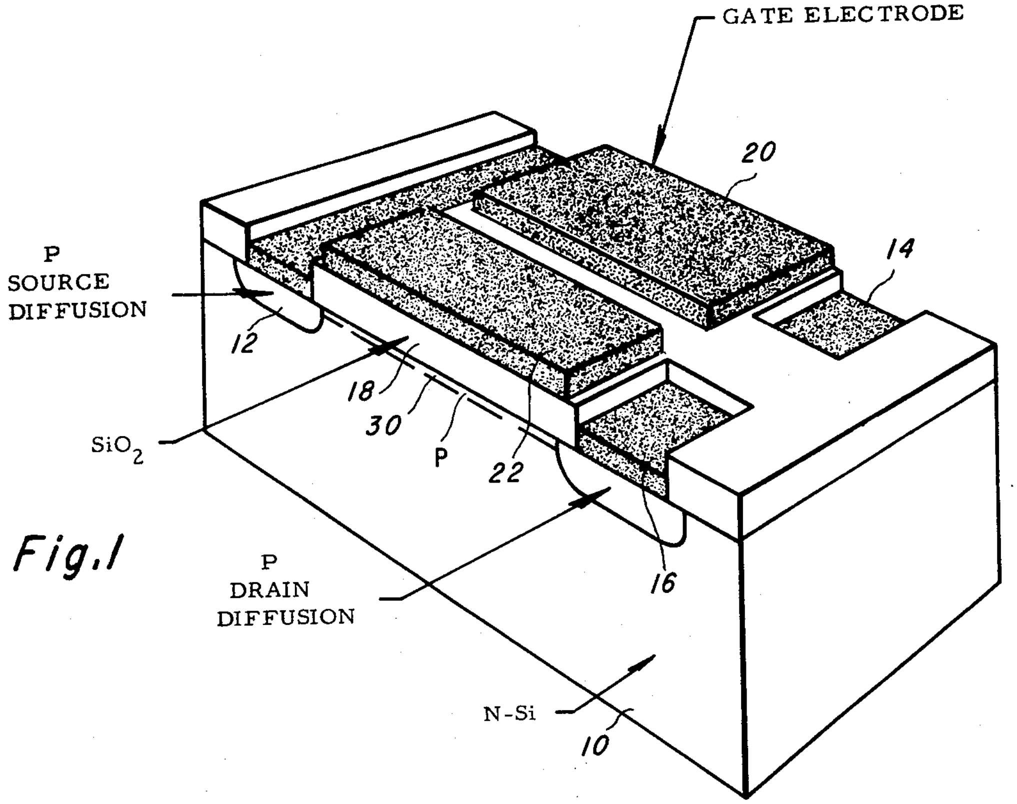
FIG. 1 is a pictorial view of one embodiment of the present invention.

With reference to FIG. 1, the substrate 10 may, for example, comprise N-type silicon having a resistivity in the range of 1–10 ohm-cm. It is understood, of course, that P-type silicon could also be advantageously utilized in accordance with the present invention by appropriate modifications well known to those skilled in the art. P-type diffusions are effected in accordance with conventional metal-insulator-semiconductor fabrication techniques to form a source region 12 and two drain regions 14 and 16. An oxide region 18, such as silicon dioxide, is formed to overlie the substrate 10. Two gate electrodes are formed to overlie the region intermediate the source 12 and drain regions 14 and 16. The two gate electrodes are shown at 20 and 22, respectively, and are spaced apart by a distance such that the longitudinal electric field in the pinch-off region of the voltage current characteristics of the IGFET lowers the potential barrier to holes between the inversion layers formed under the two gates 20 and 22, as explained hereinafter. A spacing of 4 microns or less, for example, may be desirable. The gates may be formed by conventional masking and etching techniques. If desired, a passivating layer (not shown) may be formed to overlie the structure shown in FIG. 1.

Operation of one embodiment of the present invention will now be described with reference to the schematic circuit shown in FIG. 2.

Negative potentials are applied to the gates $G_1$ and $G_2$, respectively, to produce an inversion layer under each gate at the metal/insulating layer interface. An inversion layer is shown schematically at 30 (FIG. 1) wherein the N-type semiconductor has been inverted to a P-type region by bias voltages (not shown) applied to the gate. Further, a negative potential is applied to the drain regions, shown generally at $D_1$ and $D_2$, producing a longitudinal electric field in the direction shown by arrows 32 between the source and drain. Preferably, the device is biased to operate in the saturation region of the drain characteristics of the IGFET. A negative gate voltage in the range of -6 or -7 volts with a negative drain bias on the order of -30 volts d.c. may, for example, be desirable.

Figure 2:
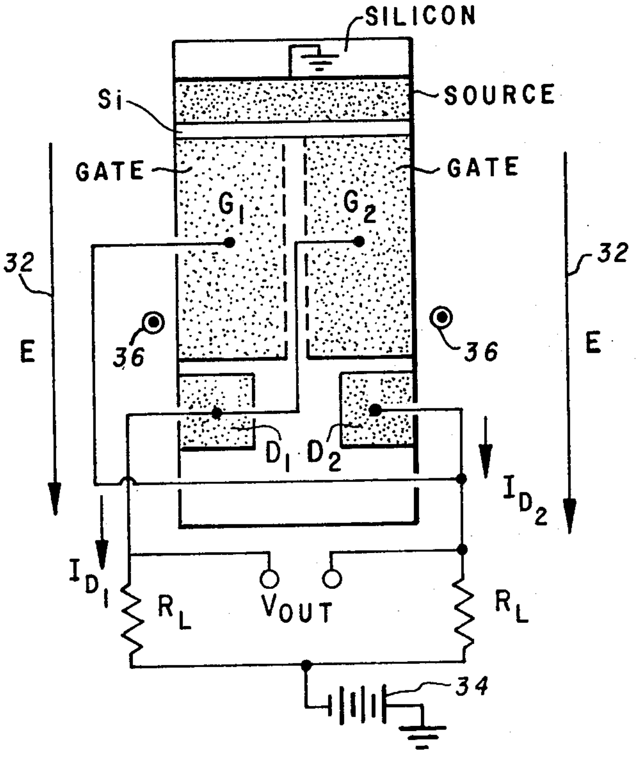
FIG. 2 is a schematic representation of the device shown in FIG. 1.

In the embodiment illustrated in FIG. 2, gates $G_1$ and $G_2$ and drains $D_1$ and $D_2$ are at the same potential, determined by the voltage source shown schematically at 34, when no magnetic field is present. It may be seen that this structure in essence defines two separate IGFET's, one device including $D_1$, $G_1$, and the source $S_1$ and the other device including $D_2$, $G_2$, and the source $S_1$. In accordance with the present invention, the gates of these two devices are formed sufficiently close to each other such that they advantageously interact in response to a magnetic field to produce an enhanced output signal as follows. When a magnetic field is applied so that it is directed out of the sheet of the drawing, as schematically illustrated by the circled arrow tips at 36, holes in the inversion layer under $G_1$ are diverted from left to right to the inversion layer under $G_2$ by the force due to the combined effects of the electric field and the magnetic field. As a result, the drain current $I_{D2}$ increases while the current $I_{D1}$ decreases. The phenomenon by which charge is transferred from the inversion layer under $G_1$ to the inversion layer under $G_2$ by the combined effect of the electric and magnetic fields present is characterized herein as magnetically induced charge coupling. The cross-connections of the drains $D_1$ and $D_2$ to gates $G_2$ and $G_1$, respectively, provides positive feedback which produces an enhanced output signal. Varying the external load resistance $R_L$ affects the sensitivity and stability of the IGFET magnetic field detector and, depending upon the design and intended use, an optimum value of $R_L$ may exist. For example, to increase sensitivity, the value of $R_L$ is increased, but from a stability viewpoint, the value of $R_L$ should preferably be limited to less than $1/g_m$ where $g_m$ is the transconductance of the device.

A magnetic field detector as above described is especially well suited for detecting the presence of magnetic domains in a magnetic bubble memory where the magnetic bubbles are propagated in magnet garnets such as disclosed in copending U.S. Pat. application, Ser. No. 129,423, entitled "MAGNETIC DOMAIN MEMORY STRUCTURE" filed concurrently herewith and assigned to the same assignee.

As may be seen from the aforementioned description of the present invention, an IGFET structure has advantageously been utilized to effect a magnetic field detector having an enhanced output signal. This has been accomplished by providing a structure that enables magnetically induced charge coupling to effect positive feedback providing the device with the advantage of having amplification characteristics.

While a specific embodiment of the present invention has been described herein, it will be apparent to persons skilled in the art the various modifications to the details of construction may be made without departing from the scope or spirit of the present invention.

What is claimed is:

1. A magnetic field detector comprising in combination:

a. a semiconductor substrate of one conductivity having first second, and third impurity-doped spaced-apart regions of opposite conductivity on one surface thereof respectively defining the source and first and second drain regions of a field effect device;

b. an insulating layer overlying said one surface;

c. means for generating a longitudinal electric field in said substrate between said source and said first and second drain regions; and d. means overlying said insulating layer intermediate said first region and said second and third regions of said substrate for forming a plurality of coplanar spaced apart inversion layers, said inversion layers respectively contacting portions of said first and second impurity doped regions, and said first and third regions, said inversion layers being spaced apart by a distance such that said longitudinal electric field lowers the potential barrier to charge carriers thereby enabling charge coupling therebetween in the presence of a magnetic field whereby a magnetic field substantially perpendicular to said one surface produces charge coupling between said adjacent inversion layers providing an amplified output signal indicative of the presence of said magnetic field.

2. A magnetic field detector as set forth in claim 1 wherein said means for forming inversion layers comprises first and second gate electrodes spaced apart by a distance on the order of 4 microns or less.

3. A magnetic field detector as set forth in claim 2 wherein said first gate is electrically connected to said second drain region and said second gate is electrically connected to said first drain region providing positive feedback in response to magnetically induced charge coupling.

4. A magnetic field detector comprising:

a. a semiconductor substrate of one conductivity having first, second and third spaced apart regions on one surface thereof, said regions being doped with impurities of opposite conductivity to form respectively the source and first and second drain regions of an insulated gate field effect device;

b. an insulating layer having means therein enabling electrical contact to said source and drain regions;

c. means for generating a longitudinal electric field in said substrate between said source and said first and second drain regions;

d. a first metal gate electrode deposited on said insulating layer to overlie a portion of said one surface between said source region and said first drain region;

e. a second metal gate electrode deposited on said insulating layer substantially parallel to said first metal gate, said second metal gate overlying a portion of said one surface between said source region and said second drain region;

f. means for generating inversion layers in the surface of said substrate under said first and second gate electrodes, said first and second gates spaced apart by a predetermined distance such that said longitudinal electric field in the pinch-off region of the voltage characteristics of said insulated gate field effect device lowers the potential barrier to charge carriers between the inversion layers respectively formed under said gates; and g. output means responsive to the change of electrical charge in said inversion layers, whereby a magnetic field substantially perpendicular to said one surface interacts with said electric field to enhance charge coupling between said first and second inversion layers thus providing a magnetic field detector having an enhanced output signal.

5. A magnetic field detector as set forth in claim 4 wherein said first and second gate electrodes are spaced apart by a distance on the order of 4 microns or less.

6. A magnetic field detector comprising;

a. a semiconductor substrate of one conductivity having first, second and third spaced apart regions on one surface thereof, said first region being doped with impurities of opposite conductivity to form the source of an insulated gate field effect device and said second and third regions being doped with impurities of said opposite conductivity to form respective first and second drain regions of an insulated gate field effect device;

b. an insulating layer having means therein enabling electrical contact to said source and drain regions;

c. a first metal gate electrode deposited on said insulating layer to overlie a portion of said one surface between said source region and said first drain region, said first gate electrode being connected to said second drain region;

d. a second metal gate electrode deposited on said insulating layer substantially parallel to said first metal gate, said first and second gate electrodes being spaced apart by a distance which enhances charge coupling between the inversion layers associated therewith responsive to a magnetic field, said second metal gate overlying a portion of said one surface between said source region and said second drain region, said second gate electrode being electrically connected to said first drain region;

e. means for generating an electric field in said substrate between said source and drain regions;

f. means for generating inversion layers in the surface of said substrate under said first and second gate electrodes; and a magnetic field detector having an enhanced output signal.

g. output means responsive to the change of electrical charge in said inversion layers, whereby a magnetic field substantially perpendicular to said one surface interacts with said electric field to enhance charge coupling between said first and second inversion layers thus providing output signal.

7. A method for detecting a magnetic field utilizing a metal-insulator-semiconductor structure which includes a semiconductor substrate of one conductivity type, spaced apart regions of opposite conductivity type from said substrate extending from one surface of said substrate and respectively defining a source region and two drain regions, a relatively thin insulating layer over said spaced apart regions defining apertures therethrough for enabling electrical contact to each of said regions, and two laterally spaced and substantially parallel conductive layers over said insulating layer defining first and second gate electrodes, said first gate overlying a portion of said substrate connecting said source with the first of said drain regions and said second gate overlying a region connecting said source with the second of said drain regions, comprising the steps of:

a. generating a longitudinal electric field between said source and said first and second drain regions;
b. generating first and second inversion layers in the surface of said substrate underlying said first and second gate electrodes;
c. applying a magnetic field substantially perpendicular to said one surface to magnetically induce charge coupling between said first and second inversion layers thereby changing the charge concentration therein and thus changing the relative voltage level at said first and second drain regions;
d. electrically connecting said first drain with said second gate electrode and said second drain with said first gate electrode to provide positive feedback thereby enhancing charge coupling; and
e. detecting the voltage difference between said first and second drain regions to provide a measure of the strength of said applied magnetic field.

8. The method for detecting a magnetic field as set forth in claim 7 wherein said inversion layers are separated by a distance on the order of 4 microns or less.

* * * * *